(12) United States Patent
Shin et al.

(10) Patent No.: US 9,178,157 B2
(45) Date of Patent: Nov. 3, 2015

(54) DONOR SUBSTRATES, METHODS OF MANUFACTURING DONOR SUBSTRATES AND METHODS OF MANUFACTURING ORGANIC LIGHT EMITTING DISPLAY DEVICES USING DONOR SUBSTRATES

(75) Inventors: Hyea-Weon Shin, Yongin (KR); Sang-Soo Kim, Yongin (KR); Sang-Hun Park, Yongin (KR); Young-Mok Son, Yongin (KR); Young-Il Kim, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 688 days.

(21) Appl. No.: 13/451,485

(22) Filed: Apr. 19, 2012

(65) Prior Publication Data

US 2013/0005211 A1 Jan. 3, 2013

(30) Foreign Application Priority Data

Jun. 29, 2011 (KR) .................. 10-2011-0063556

(51) Int. Cl.
*H01J 9/00* (2006.01)
*H01L 51/00* (2006.01)
*H01L 27/32* (2006.01)

(52) U.S. Cl.
CPC ........ *H01L 51/0013* (2013.01); *H01L 27/3211* (2013.01); *H01L 27/3246* (2013.01); *Y02E 10/549* (2013.01)

(58) Field of Classification Search
CPC ............ H01J 9/20; H01J 61/35; H01J 9/247; H01L 51/0013; H01L 27/3211
USPC ........................................ 445/24, 58
See application file for complete search history.

(56) References Cited

U.S. PATENT DOCUMENTS

| 2005/0118525 | A1* | 6/2005 | Kim et al. ............... 430/200 |
| 2009/0203285 | A1 | 8/2009 | Kobayashi |

FOREIGN PATENT DOCUMENTS

| JP | 2009-187810 | 8/2009 |
| JP | 2010-080439 | 4/2010 |
| JP | 2010-267410 | 11/2010 |

* cited by examiner

*Primary Examiner* — Joseph L Williams
(74) *Attorney, Agent, or Firm* — Christie, Parker & Hale, LLP

(57) ABSTRACT

A donor substrate having a plurality of recesses and isolation structures may be provided. The isolation structures may be defined by the recesses. A first electrode is formed on a first substrate. A pixel defining layer may be formed on the first electrode to define a plurality of pixel regions. The donor substrate may be arranged over the first substrate, and a laser induced thermal imaging process may be performed to form a plurality of light emitting layers in the pixel regions. A second electrode may be formed on the pixel defining layer and the light emitting layers. The organic light emitting layers having minute dimensions may be effectively obtained from the donor substrate. The isolation structures may be formed integrally with the substrate, and thus the donor substrate may be easily recycled after the laser induced thermal imaging process.

12 Claims, 5 Drawing Sheets

DONOR SUBSTRATES, METHODS OF MANUFACTURING DONOR SUBSTRATES AND METHODS OF MANUFACTURING ORGANIC LIGHT EMITTING DISPLAY DEVICES USING DONOR SUBSTRATES

CROSS-REFERENCE TO RELATED PATENT APPLICATION

This application claims priority under 35 U.S.C. §119 to and the benefit of Korean patent Application No. 2011-0063556, filed on Jun. 29, 2011, the disclosure of which is hereby incorporated by reference herein in its entirety.

BACKGROUND

1. Field

Example embodiments of the invention relate to donor substrates, methods of manufacturing donor substrates and methods of manufacturing organic light emitting display devices using donor substrates.

2. Description of Related Art

Generally, an organic light emitting display device may include a thin film transistor, a pixel electrode, an organic layer, a common electrode, etc. The organic layer may include an organic light emitting layer emitting at least one of a white color of light, a red color of light, a green color of light and a blue color of light. The organic layer may additionally include a hole injection layer (HIL), a hole transfer layer (HTL), an electron transfer layer (ETL), an electron injection layer (EIL), etc.

In a process for forming organic light emitting layers in a comparable organic light emitting display device, a red organic transfer layer, a green organic transfer layer and a blue organic transfer layer may be formed on a donor substrate, and then the organic transfer layers may be transferred onto the pixel electrode using a laser beam, thereby forming the organic light emitting layers on pixel electrodes of pixels in the comparable light emitting display device. In this case, contaminations of the organic light emitting layers may be frequently generated because of static electricity, and color mixing of adjacent pixels in the comparable organic light emitting display devices may likely occur.

SUMMARY

Aspects of example embodiments are directed toward donor substrates that are easily reusable and capable of effectively transferring micro-sized organic transfer layers.

Aspects of example embodiments are directed toward methods of manufacturing donor substrates that are easily reusable and capable of effectively transferring micro-sized organic transfer layers.

Aspects of example embodiments are directed toward methods of manufacturing organic light emitting display devices using donor substrates that are easily reusable and capable of effectively transferring micro-sized organic transfer layers.

Aspects of example embodiments of the invention are directed toward donor substrates having recess structures, methods of manufacturing donor substrates having recess structures and methods of manufacturing organic light emitting display devices using donor substrates having recess structures.

According to example embodiments, there is provided a donor substrate including a substrate, a light-to-heat conversion layer and an organic transfer layer. The substrate may have a recess and an isolation structure adjacent to the recess. The light-to-heat conversion layer may be disposed in the recess. The organic transfer layer may be disposed on the light-to-heat conversion layer.

In example embodiments, the donor substrate may further comprise a lower layer disposed between a lower surface of the recess and the light-to-heat conversion layer.

In example embodiments, the lower layer may include silicon, acryl-resin, polyimide-resins, siloxane-based resin, benzocyclobutene, silicon oxide and/or metal oxide.

In example embodiments, the lower layer may include a coating layer and a heat radiation layer.

In example embodiments, the substrate may include a material which is transparent to a laser beam.

In example embodiments, the light-to-heat conversion layer may include metal, metal oxide, metal sulfide and/or carbon black.

In example embodiments, the light-to-heat conversion layer may include nickel, molybdenum, titanium, zirconium, copper, vanadium, tantalum, palladium, ruthenium, iridium, gold, silver, platinum, oxide thereof and/or sulfide thereof.

In example embodiments, the organic transfer layer may include a red organic transfer layer, a green organic transfer layer or a blue organic transfer layer.

According to example embodiments, there is provided a donor substrate including a substrate, a first light-to-heat conversion layer, a second light-to-heat conversion layer, a third light-to-heat conversion layer, a red organic transfer layer, a green organic transfer layer and a blue organic transfer layer. The substrate may have a first recess, a second recess, a third recess and isolation structures. The isolation structure may be defined by the first, the second and the third recesses. The first, the second and the third light-to-heat conversion layers may be disposed in the first, the second and the third recesses, respectively. The red organic transfer layer may be disposed on the first light-to-heat conversion layer. The green organic transfer layer may be disposed on the second light-to-heat conversion layer. The blue organic transfer layer may be disposed on the third light-to-heat conversion layer.

In example embodiments, the donor substrate may further comprise a first lower, a second lower and a third lower layer disposed between lower surfaces of the first, the second and the third recesses and the first, the second and the third light-to-heat conversion layers, respectively.

In example embodiments, the first, the second and the third lower layers may include silicon, acryl-based resin, polyimide-based resin, siloxane-based resin, benzocyclobutene, silicon oxide and/or metal oxide.

In example embodiments, the first, the second and the third lower layers may include a coating layer and a heat radiation layer, respectively.

According to example embodiments, there is provided a method of manufacturing a donor substrate. In the method, a recess and an isolation structure may be formed on a substrate. The isolation structure may be defined by the recess. A lower layer may be formed on the recess. A light-to-heat conversion layer may be formed on the lower layer. An organic transfer layer may be formed on the light-to-heat conversion layer.

In example embodiments, the forming of the recess may comprise forming a mask on the substrate and partially removing the substrate using the mask, thereby forming the recess and the isolation structure.

In example embodiments, the forming of the recess may include a sand blast process, a dry etching process or a wet etching process.

In example embodiments, the forming of the lower layer may include a nozzle printing process, an ink-jet printing process, a doctor blade printing process, an offset printing process or a green sheet lamination process.

In example embodiments, the forming of the light-to-heat conversion layer may include a nozzle printing process, an ink-jet printing process, a doctor blade printing process, an offset printing process, a gravure printing process, a gravure offset printing process or a slit printing process.

In example embodiments, the forming of the light-to-heat conversion layer may include a green sheet lamination process, a lamination process or a transfer process.

In example embodiments, the forming of the organic transfer layer may include a nozzle printing process, an ink-jet printing process, a doctor blade printing process, an offset printing process, a gravure printing process, a gravure offset printing process, a slit printing process, a green sheet lamination process or a lamination process.

According to example embodiments, there is provided a method of manufacturing an organic light emitting display device. In the method, a donor substrate having a plurality of recesses and isolation structures may be formed. The isolation structures may be defined by the recesses. A first electrode may be formed on a first substrate. A pixel defining layer may be formed on the first electrode to define a plurality of pixel regions. The donor substrate may be arranged over the first substrate, and a laser transfer process may be performed to form a plurality of light emitting layers in the pixel regions. A second electrode may be formed on the pixel defining layer and the light emitting layers.

In example embodiments, the donor substrate may include a plurality of light-to-heat conversion layers formed on the recesses and a plurality of organic transfer layers formed on the light-to-heat conversion layers.

In example embodiments, the forming of the light emitting layers may further include matching the pixel defining layer to the isolation structure.

In example embodiments, the laser transfer process may be performed at a reduced pressure or an atmospheric pressure.

According to example embodiments, a donor substrate may include a light-to-heat conversion layer and an organic transfer layer in recesses. Portions of a substrate between the recesses may serve as isolation structure. An organic light emitting layer having a micro size may be effectively obtained from the donor substrate. Isolation structures may be formed integrally with the substrate, and thus the donor substrate may be reusable after the laser transfer process.

BRIEF DESCRIPTION OF THE DRAWINGS

Example embodiments may be understood in more detail from the following description taken in conjunction with the accompanying drawings, in which.

DETAILED DESCRIPTION

Figure 1:
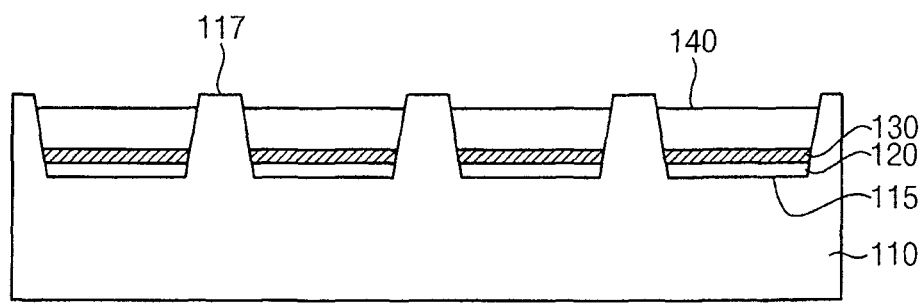
FIG. 1 is a cross sectional view illustrating a donor substrate in accordance with example embodiments.

Various example embodiments will be described more fully hereinafter with reference to the accompanying drawings, in which some example embodiments are shown. The invention may, however, be embodied in many different forms and should not be construed as limited to the example embodiments set forth herein. Rather, these example embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer; or one or more intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges, rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross sectional view illustrating a donor substrate in accordance with example embodiments.

Referring to FIG. 1, a donor substrate 100 may include a substrate 110 having at least one of a recess 115, a lower layer 120, a light-to-heat conversion layer 130 and an organic transfer layer 140. The lower layer 120, the light-to-heat conversion layer 130 and the organic transfer layer 140 may be sequentially disposed in the recess 115. In example embodiments, a plurality of lower layers 120, a plurality of light-to-heat conversion layers 130 and a plurality of organic transfer layers 140 are disposed in a plurality of recesses 115 when the plurality of recesses 115 are disposed at an upper portion of the substrate 110.

The substrate 110 may include a transparent substrate such as a glass substrate, a quartz substrate, a transparent silicon substrate, a transparent plastic substrate, etc. Examples of the transparent plastic substrate may include polyethylene terephthalate (PET), polyacryl, polyepoxy, polyethylene, polystyrene, polyimide, polycarbonate, polyether, polyacrylate, etc. In example embodiments, the substrate 110 may include the glass substrate and/or the quartz substrate. The substrate 110 may include a material having a sufficient mechanical strength to transmit and to transfer a laser beam to the light-to-heat conversion layer 130 in a laser induced thermal imaging process. In this case, the glass substrate and/or the quartz substrate may be easily processed to have a set or predetermined structure and may not be deformed in a high temperature process, so that the glass substrate and/or the quartz substrate may serve as the substrate 110 employed in example embodiments.

In example embodiments, the plurality of recesses 115 may be disposed at the upper portion of the substrate 110. Each of the recesses 115 having a set or predetermined dimension may be disposed on the substrate 10 with a set or predetermined distance. The recesses 115 may be arranged substantially corresponding to a layout of pixels or sub-pixels of an organic light emitting display device. For example, the substrate 110 may include the glass substrate, and each recess 115 disposed at the upper portion of the substrate 110 may have a depth of about 100 nm to about 10 μm from an upper face of the substrate 110.

Upper portions of the substrate 110 with the recesses 115 may be defined as isolation structures 117 substantially corresponding to boundaries of pixel regions of the organic light emitting display device. For example, each of the isolation structures 117 may be disposed between adjacent recesses 115. The isolation structures 117 may serve as barrier ribs to protect or prevent the organic transfer layer 140 from being mixed into adjacent pixels. In example embodiments, the isolation structures 117 and the substrate 110 may be integrally formed. Thus, a desired mechanical strength of the donor substrate 100 may be ensured, and the donor substrate 100 may be easily recycled after the laser induced thermal imaging process.

The lower layer 120 may be disposed on the substrate 110 to partially fill the recess 115. For example, the lower layer 120 may include silicon (Si), acryl-based resin, polyimide-based resin, siloxane-based resin, benzocyclobutene (BCB), silicon oxide (SiOx), metal oxide, etc. The lower layer 120 may serve as a coating layer which may reduce a surface roughness of the substrate 110. Further, the lower layer 120 may serve as a heat radiation layer which may radiate a heat generated from the light-to-heat conversion layer 130 in the laser thermal imaging process. Although the lower layer 120 having a single layer structure is illustrated in FIG. 1, the lower layer 120 may have a double layer structure that includes a coating layer and a heat radiation layer. Here, the coating layer and the heat radiation layer may include different materials, respectively.

The light-to-heat conversion layer 130 may be disposed on the lower layer 120 in the recess 115. The light-to-heat conversion layer 130 may absorb the laser beam irradiated into the substrate 110 and may convert the laser beam energy into a thermal energy. In example embodiments, the light-to-heat conversion layer 130 may include metal, metal oxide, metal sulfide, carbon black, etc. For example, the light-to-heat conversion layer 130 may include metal such as aluminum (Al), nickel (Ni), molybdenum (Mo), titanium (Ti), zirconium (Zr), copper (Cu), vanadium (V), tantalum (Ta), palladium (Pd), ruthenium (Ru), iridium (Ir), gold (Au), silver (Ag), platinum (Pt), oxides of these metals, sulfides of these metals, etc. These may be used alone or in a combination thereof.

The organic transfer layer 140 may be disposed on the light-to-heat conversion layer 130. The organic transfer layer 140 may fully or partially fill the recess 115. For example, the organic transfer layer 140 may have a thickness of about 30 Å to about 500 Å from an upper face of the light-to-heat conversion layer 130.

An organic light emitting layer of the organic light emitting display device may be obtained from the organic transfer layer 140 of the donor substrate 100. In example embodiments, the organic transfer layer 140 may include a red organic transfer layer, a green organic transfer layer or a blue organic transfer layer. In this case, the organic transfer layer 140 may include an organic light emitting host material and an organic light emitting host material dopant material doped in the organic light emitting host material. Examples of the organic light emitting host material may include 4,4'-N,N' dicarbazole-biphenyl (CBP), bis(2-methyl-8-quinolinato)-4-phenylphenolate aluminum (BAlq), 2,9-dimethyl-4,7-diphenyl-1,10-phenanthroline (BCP), (N,N-dicarbazolyl-1,4-dimethene-benzene (DCB), rubrene, distyrylarylene (DSA) derivative, oxadiazole derivative, anthracene derivative, etc. When the organic light emitting dopant material includes a fluorescent dopant, examples of the organic light emitting dopant material may include a distyrylamine derivative, an oxadiazole derivative, an anthracene derivative, a perylene derivative, a quinacridone derivative, a distyrylbiphenyl derivative, 10-(2-benzothiazolyl)-1,1,7,7-tetramethyl-2,3,6, 7-tetrahydro-1H,5H,11H-(1) benzopyrano(6,7-8-I,j)quinolizin-11-one (C545T), 4-(dicyanomethylene)-2-t-butyl-6-(1, 1,7,7-tetramethyljulolidyl-9-enyl)-4H-pyran (DCJTB), 4-(dicyanomethylene)-2-methyl-6-(4-dimethylaminostyril)-4H-pyrane (DCM), etc. Alternatively, when the organic light emitting dopant material includes a phosphorescence dopant, examples of the organic light emitting dopant material may include iridium(m)bis[4,6-di-fluorophenyl)-pyridinato-N, C2']picolinate ($F_2$Irpic), ($F_2$ppy)$_2$Ir(tmd), tris(2-phenylpyridine) iridium (III) (Ir(PPy)$_3$), PQIr, Btp$_2$Ir(acac), 2,3,7,8,12, 13,17,18-octaethyl-21H,23H-porphine platinum (II) (PtOEP), Ir(piq)$_2$(acac), etc.

In example embodiments, the organic transfer layer 140 may include a hole injection layer, a hole transfer layer, an electron transfer layer, an electron injection layer, etc. In this case, the hole injection layer may include aryl amine compounds, phthalocyanine compounds, starburst amine, etc. For example, the hole injection layer may include 4,4',4"-tris(3-methylphenylamino)triphenylamine (m-MTDATA), 1,3,5-tris[4-(3-methylphenylamino)phenyl]benzene, phthalocyanine copper (CuPc), etc. The hole transfer layer may include an arylene diamine derivative, a starburst compound, a biphenyl diamine derivative having a Spiro group and/or a ladder compound. For example, the hole transfer layer may include N,N'-diphenyl-N,N'-bis(3-methylphenyl)-1,1'-biphenyl-4, 4'-diamine (TPD), N,N-di(naphthalene-1-yl)-N,N'-diphenylbenzidine (α-NPD), 4,4'-bis[N-(1-naphthyl-1-)-N-phenylamino]-biphenyl (NPB), etc. Further, the electron transfer layer may include TAZ, PBD, spiro-PBD, Alq3, BAlq and/or SAlq, and the electron transfer layer may include Lif, a gallium (Ga) complex, Liq and/or CsF.

As for the donor substrate 100 in accordance with example embodiments, the light-to-heat conversion layer 130 and the organic transfer layer 140 may be disposed in at least one recess 115 provided on the substrate 110, and portions of the substrate 110 between adjacent recesses 115 may serve as the isolation structures 117. Thus, an organic light emitting layer having a minute dimension may be effectively obtained from the donor substrate 100. Further, the isolation structures 117 may be formed integrally with the substrate 110, and thus the donor substrate 100 may be easily recycled after the laser induced thermal imaging process.

Figure 2:
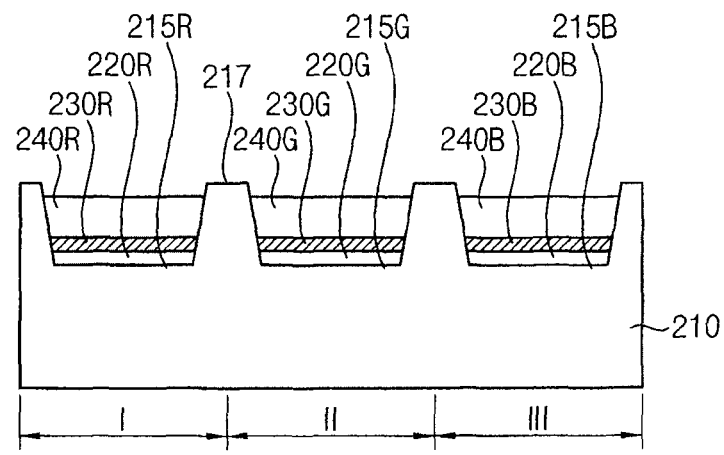
FIG. 2 is a cross sectional view illustrating a donor substrate in accordance with some example embodiments.

FIG. 2 is a cross sectional view illustrating a donor substrate in accordance with some example embodiments.

Referring to FIG. 2, a donor substrate 200 may include a substrate 210, a first recess 215R, a second recess 215G, a third recess 215B, a first lower layer 220R, a second lower layer 220G, a third lower layer 220B, a first light-to-heat conversion layer 230R, a second light-to-heat conversion layer 230G, a third light-to-heat conversion layer 230B, a first organic transfer layer 240R, a second organic transfer layer 240G, a third organic transfer layer 240B, etc.

In example embodiments, the substrate 210 may have a first region (I), a second region (II) and a third region (III). A first recess 215R, a second recess 215G and a third recess 215B may be disposed in the first region (I), the second region (II) and the third region (III), respectively. Further, the first to the third lower layers 220R, 220G and 220B, the first to the third light-to-heat conversion layers 230R, 230G and 230B and the first to the third organic transfer layers 240R, 240G and 240B may be sequentially disposed in the first to the third recesses 215R, 215G and 215B, respectively. Here, the first region (I), the second region (II) and the third region (III) of the substrate 210 may be substantially corresponding to a red sub pixel, a green sub pixel and a blue sub pixel of an organic light emitting display device.

The substrate 210 may include a transparent substrate, for example, a glass substrate, a quartz substrate, a transparent silicon substrate, a transparent plastic substrate, etc. The substrate 210 may include a transparent material having a sufficient mechanical strength for transferring a laser beam to the first, the second and the third light-to-heat conversion layers 230R, 230G and 230B in a laser thermal induced imaging process. For example, the glass substrate or the quartz substrate may be easily processed to have a set or predetermined structure and may be structurally stable in a high temperature process, so that the glass substrate or the quartz substrate may serve as the substrate 210 employed in example embodiments.

The first, the second and the third recesses 215R, 215G and 215B may be arranged to substantially correspond to a layout of the red sub-pixel, the green sub-pixel and the blue sub-pixel of the organic light emitting display device. For example, each of the first, the second and the third recesses 215R, 215G and 215B may have a depth of about 100 nm to about 10 μm from an upper face of the substrate 210. Upper portions of the substrate 210 with the first, the second and the third recesses 215R, 215G and 215B may serve as isolation structures 217. The isolation structures 217 may substantially correspond to boundaries of the red, the green and the blue sub-pixel regions of the organic light emitting display device. The isolation structures 217 may serve as barrier ribs for protecting or preventing the first, the second and the third organic transfer layers 240R, 240G and 240B from being mixed into adjacent pixels. In example embodiments, the isolation structures 217 may be formed integrally with the substrate 210, so that a mechanical strength of the donor substrate 200 may be desirably ensured and the donor substrate 200 may be recycled after the laser induced thermal imaging process.

The first, the second and the third lower layers 220R, 220G and 220B may be disposed on bottom faces of the first, the second and the third recesses 215R, 215G and 215B to partially fill the first, the second and the third recesses 215R, 215G and 215B, respectively. The first, the second and the third lower layers 220R, 220G and 220B may serve as coating layers for reducing a surface roughness of the substrate 210. Further, the first, the second and the third lower layers 220R, 220G and 220B may serve as heat radiation layers for radiating heat generated from the first, the second and the third light-to-heat conversion layers 230R, 230G and 230B in the laser induced thermal imaging process. For example, each of the first, the second and the third lower layers 220R, 220G and 220B may include silicon, acryl-based resin, polyimide-based resin, siloxane-based resin, benzocyclobutene, silicon oxide, metal oxide, etc. In some example embodiments, each of the first, the second and the third lower layers 220R, 220G and 220B may include a coating layer and a heat radiation layer, which may include different materials, respectively.

The first, the second and the third light-to-heat conversion layers 230R, 230G and 230B may be disposed on the first, the second and the third lower layers 220R, 220G and 220B to partially fill the first, the second and the third recesses 215R, 215G and 215B. Each of the first, the second and the third light-to-heat conversion layers 230R, 230G and 230B may include metal, metal oxide, metal sulfide, carbon black, etc. Each of the first, the second and the third light-to-heat conversion layers 230R, 230G and 230B may absorb a laser beam irradiated into the substrate 210 and may convert the laser beam energy to a thermal energy. For example, the first, the second and the third light-to-heat conversion layers 230R, 230G and 230B may be obtained by a nozzle printing process, an ink-jet printing process, a doctor blade printing process, an offset printing process and a green sheet lamination process, etc.

The first, the second and the third organic transfer layers 240R, 240G and 240B may be disposed on the first, the second and the third light-to-heat conversion layers 230R, 230G and 230B, respectively. The first, the second and the third organic transfer layers 240R, 240G and 240B may fully or partially fill the first, the second and the third recesses 215R, 215G and 215B. In example embodiments, the first organic transfer layer 240R, the second organic transfer layer 240G and the third organic transfer layer 240B may include a red organic transfer layer, a green organic transfer layer and a blue organic transfer layer, respectively.

When a pixel region of the organic light emitting display device includes a red sub-pixel region, a green sub-pixel region and a blue sub-pixel region, the first, the second and the third organic transfer layers 240R, 240G and 240B may be formed on portions of the donor substrate 200 to substantially correspond to the sub pixel regions. Then, the first, the second and the third organic transfer layers 240R, 240G and 240B may be transferred onto the sub-pixel regions by a laser irradiation process. Thus, the organic light emitting layers of the organic light emitting display device may be formed from the first, the second and the third organic transfer layers 240R, 240G and 240B of the donor substrate 200. Each of the first, the second and the third organic transfer layers 240R, 240G and 240B may include an organic light emitting host material, and an organic light emitting dopant material doped in the organic light emitting host material.

In example embodiments, each of the first, the second and the third organic transfer layers 240R, 240G and 240B may additionally include a hole injection layer, a hole transfer layer, an electron injection layer and an electron transfer layer. Further, the first, the second and the third organic transfer layers 240R, 240G and 240B may be obtained by a nozzle printing process, an ink-jet printing process, a doctor blade printing process, an offset printing process, a slit printing process, a green sheet lamination process, etc.

In the donor substrate 200 according to example embodiments, the first, the second and the third organic transfer layers 240R, 240G and 240B may be disposed in the first, the second and the third recesses 215R, 215G and 215B located at the substrate 210, respectively. Portions of the substrate 210 among the first, the second and the third recesses 215R, 215G and 215B may serve as the isolation structures 217. Hence, organic light emitting layers having minute dimensions may be effectively obtained from the first to the third organic transfer layers 240R, 240G and 240B. Further, the isolation structures 217 may be formed integrally with the substrate 210, and thus the donor substrate 200 may be easily recycled after the laser induced thermal imaging process.

FIGS. 3 to 6 are cross sectional views illustrating a method of manufacturing a donor substrate in accordance with some example embodiments. The donor substrate obtained by the method illustrated in FIGS. 3 to 6 may have a construction substantially the same as or substantially similar to that of the donor substrate described with reference to FIG. 2.

Figure 3:
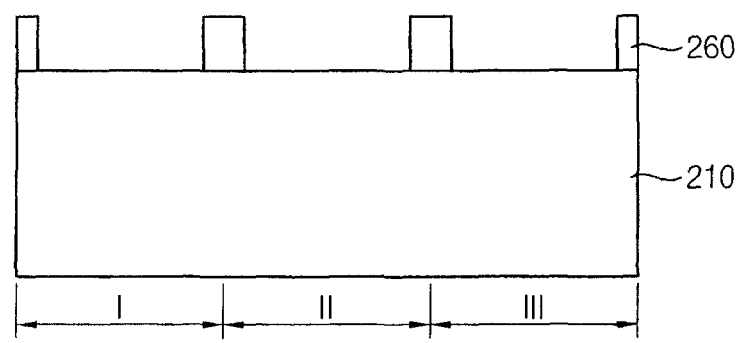
FIGS. 3 to 6 are cross sectional views illustrating a method of manufacturing a donor substrate in accordance with example embodiments.

Referring to FIG. 3, a mask 260 may be formed on a substrate 210. The substrate 210 may include a transparent material such as glass, quartz, transparent silicon, a transparent plastic, etc. Examples of the transparent plastic in the substrate 210 may include polyethylene terephthalate, polyacryl, polyepoxy, polyethylene, polystyrene, polyimide, polycarbonate, polyether, polyacrylate, etc. In example embodiments, the substrate 210 may include a glass substrate and/or a quartz substrate considering a thermal conductivity, a mechanical stability and a processability thereof.

The mask 260 may include a sand blasting resist pattern, a metal mask pattern, a photoresist pattern, etc. In example embodiments, the mask 260 including the sand blasting resist pattern may be provided on the substrate 210 by laminating a dry film resist (DFR) on the substrate 210, by forming a photo mask on the dry film resist and by performing an exposure process and a developing process. The mask 260 may expose set or predetermined portions of the substrate 210.

Figure 4:
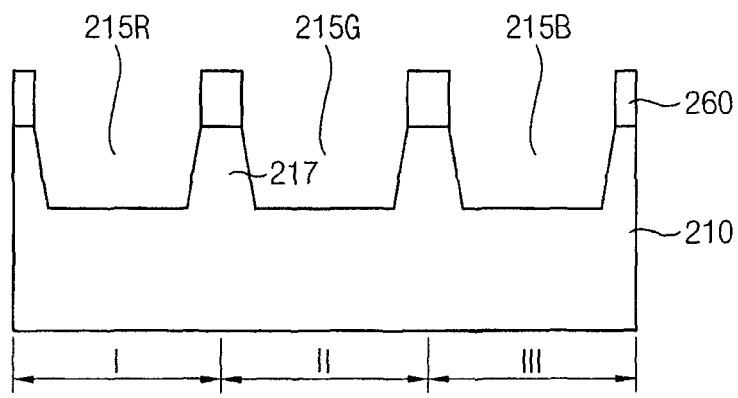

Referring to FIG. 4, the substrate 210 may be partially removed using the mask 260, thereby forming a first recess 215R, a second recess 215G and a third recess 215B on the substrate 210. In example embodiments, when the substrate 210 includes the glass substrate and/or the quartz substrate, a sand blasting process, a wet etching process and/or a dry etching process may be performed on the substrate 210 to remove portions of the substrate 210. However, other processes may be performed on the substrate 210 in accordance with ingredients of the substrate 210. For example, when the sand blasting process is performed on the substrate 210 including glass, a sand blasting device may spray sand particles to the substrate 210 having the mask 260 thereon, so that portions of the substrate 210 exposed by the mask 260 may be removed to form the first to the third recesses 215R, 215G and 215B. In some example embodiments, the substrate 210 may be partially removed by a dry etching process such as an ion beam etching process and/or a wet etching process using an etching solution including sulfuric acid and/or hydrofluoric acid, to thereby form the first to the third recesses 215R, 215G and 215B.

In example embodiments, each of the first, the second and the third recesses 215R, 215G and 215B may have a dimension substantially corresponding to that of each sub-pixel region or each pixel region of the organic light emitting display device. Further, each of the first, the second and the third recesses 215R, 215G and 215B may have a depth in a range of about 100 nm to about 10 μm.

The first, the second and the third recesses 215R, 215G and 215B may be formed on the substrate 210, so that portions of the substrate 210 adjacent to the first, the second and the third recesses 215R, 215G and 215B may be defined as isolation structures 217. The isolation structures 217 may substantially correspond to boundaries of the pixel regions or the sub-pixel regions.

Figure 5:
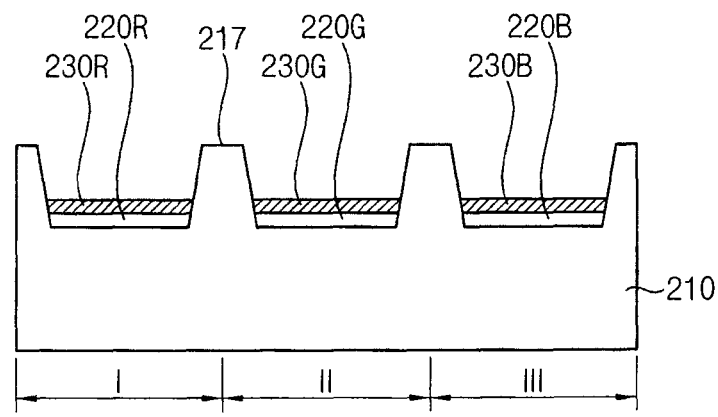

Referring to FIG. 5, the mask 260 may be removed from the substrate 210, and then a first lower layer 220R, a second lower layer 220G and a third lower layer 220B may be formed on the first recess 215R, the second recess 215G and the third recess 215B, respectively. Further, a first light-to-heat conversion layer 230R, a second light-to-heat conversion layer 230G and a third light-to-heat conversion layer 230B may be formed on the first lower layer 220R, the second lower layer 220G and the third lower layer 220B, respectively.

The first, the second and the third lower layers 220R, 220G and 220B may be formed using silicon, acryl-based resin, polyimide-based resin, siloxane-based resin, benzocyclobutene, silicon oxide, metal oxide, etc. The first, the second and the third lower layers 220R, 220G and 220B may serve as coating layers for reducing a surface roughness of the substrate 210. Further, the first, the second and the third lower layers 220R, 220G and 220B may serve as heat radiation layers for radiating heats generated from the first, the second and the third light-to-heat conversion layers 230R, 230G and 230B in a laser induced thermal imaging process. Although each of first, the second and the third lower layers 220R, 220G and 220B having a single layer structure is illustrated in FIG.

5, each of the first, the second and the third lower layers 220R, 220G and 220B may have a double layer structure including a coating layer and a heat radiation layer.

The first, the second and the third light-to-heat conversion layers 230R, 230G and 230B may be located on the first, the second and the third lower layers 220R, 220G and 220B, respectively. In example embodiments, the first, the second and the third light-to-heat conversion layers 230R, 230G and 230B may be formed using metal, metal oxide, metal sulfide, carbon black, etc. For example, the first, the second and the third light-to-heat conversion layers 230R, 230G and 230B may include aluminum, nickel, molybdenum, titanium, zirconium, copper, vanadium, tantalum, palladium, ruthenium, iridium, gold, silver, platinum, oxides thereof, sulfides thereof, etc. These may be used alone or in a combination thereof. The first, the second and the third light-to-heat conversion layers 230R, 230G and 230B may be formed by a green sheet lamination process, an ion plating process, a printing process, a chemical vapor deposition process, a sputtering process, etc. In some example embodiments, when each of the first, the second and the third light-to-heat conversion layers 230R, 230G and 230B include nickel and molybdenum, first green sheets including nickel and second green sheets including molybdenum may be sequentially formed on the first, the second and the third lower layers 220R, 220G and 220B. Then, the first green sheets and the second green sheets may be sintered to form the first, the second and the third light-to-heat conversion layers 230R, 230G and 230B including nickel layers and molybdenum layers, respectively.

Figure 6:
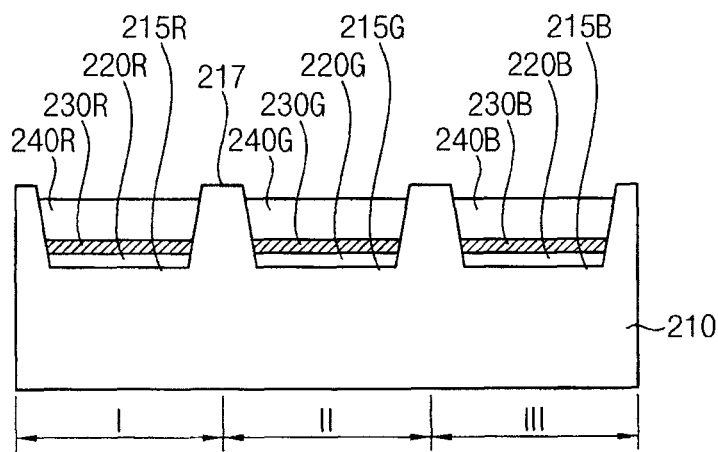

Referring to FIG. 6, a first organic transfer layer 240R, a second organic transfer layer 240G and a third organic transfer layer 240B may be formed on the first light-to-heat conversion layer 230R, the second light-to-heat conversion layer 230G and the third light-to-heat conversion layer 230B, respectively. For example, each of the first, the second and the third organic transfer layers 240R, 240G and 240B may have a thickness in a range of about 30 Å to about 500 Å. In example embodiments, the first, the second and the third organic transfer layers 240R, 240G and 240B may include a red organic transfer layer, a green organic transfer layer and a blue organic transfer layer, respectively. In some example embodiments, each of the first, the second and the third organic transfer layers 240R, 240G and 240B may include at least two of the red organic transfer layer, the green organic transfer layer and the blue organic transfer layer. For example, each of the first, the second and the third organic transfer layers 240R, 240G and 240B may include the red organic transfer layer and the green organic transfer layer, or may include the red organic transfer layer, the green organic transfer layer and the blue organic transfer layer.

In example embodiments, organic light emitting layers of the organic light emitting display device may be formed from the first, the second and the third organic transfer layers 240R, 240G and 240B of the donor substrate. In this case, the first, the second and the third organic transfer layers 240R, 240G and 240B may include organic light emitting host materials and organic light emitting dopant materials, respectively. For example, the first, the second and the third organic transfer layers 240R, 240G and 240B may be formed by a nozzle printing process, an ink-jet printing process, a slit printing process, a green sheet lamination process, etc.

In some example embodiments, additional coating layer including hydrophobic solutions may be formed on upper faces of the isolation structures 217. The additional coating layers may protect or prevent solutions including organic transfer material being mixed into adjacent recesses while forming the first, the second and the third organic transfer layers 240R, 240G and 240B. Here, the additional coating layers including hydrophobic solutions may be formed by mixing resins with hydrophobic materials such as fluorine-based polymer and by coating mixtures of the resins and the hydrophobic materials on the upper faces of the isolation structures 217. In some example embodiments, each of the first, the second and the third organic transfer layers 240R, 240G and 240B may further include a hole injection layer, a hole transfer layer, an electron transfer layer, an electron injection layer, etc.

Figure 7A:
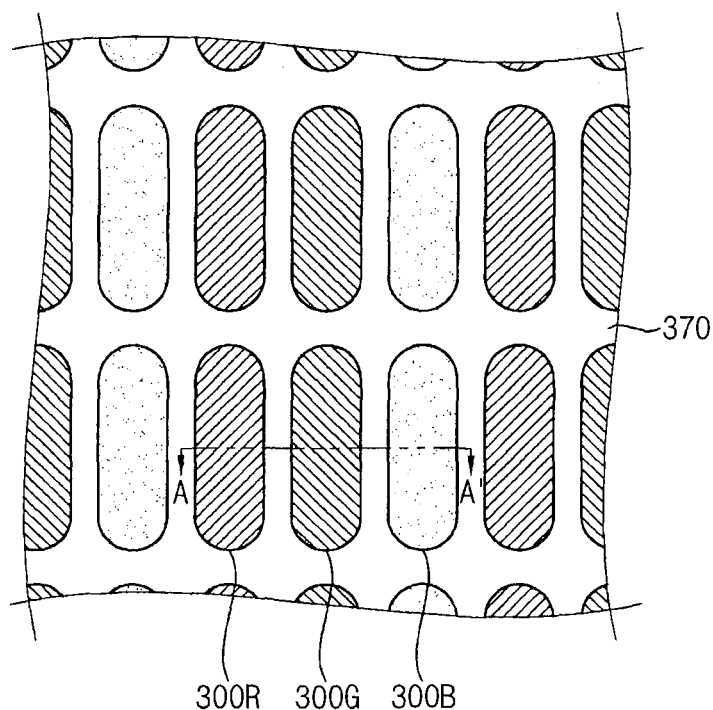
FIG. 7A is a plan view illustrating an organic light emitting display device in accordance with example embodiments.
Figure 7B:
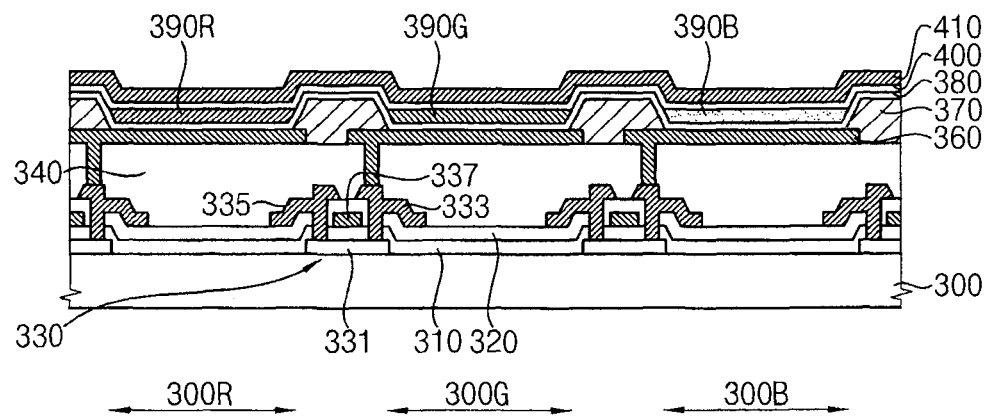
FIG. 7B is a cross sectional view illustrating an organic light emitting display device in accordance with example embodiments.

FIGS. 7A and 7B are a plan view and a cross sectional view illustrating an organic light emitting display device in accordance with example embodiments. FIG. 7B is a cross sectional view illustrating the organic light emitting display device taken along a line A-A' in FIG. 7A.

Referring to FIG. 7A, the organic light emitting display device may include a pixel region and an isolation pattern (pixel defining layer) 370. The pixel region of the organic light emitting display device may include a red sub-pixel region 300R, a green sub-pixel region 300G and a blue sub-pixel region 300B. The red, the green and the blue sub-pixel regions 300R, 300G and 300B may be spaced apart by the isolation pattern (pixel defining layer) 370. The red, the green and the blue sub-pixel regions 300R, 300G and 300B may be arranged in a first direction substantially parallel to a first substrate 300 and along a second direction substantially perpendicular to the first direction.

Referring to FIG. 7B, the organic light emitting display device may include the first substrate 300, a thin film transistor 330, a first insulating interlayer 320, a second insulating interlayer 340, a first electrode 360, the pixel defining layer 370, a hole injection layer 380, a red light emitting layer 390R, a green light emitting layer 390G, a blue light emitting layer 390B, an electron injection layer 400, a second electrode 410, etc.

The first substrate 300 may include a glass substrate and/or a quartz substrate. The thin film transistor 330 may be provided on the first substrate 300. The thin film transistor 330 may include a gate insulation layer 310, an active pattern 331, a drain electrode 333, a source electrode region 335, a gate electrode 337, etc.

The active pattern 331 may be disposed on the first substrate 300, and may include polysilicon. Although it is not illustrated, the active pattern 331 may have a source region, a drain region and a channel region. The gate insulation layer 310 may be located on the first substrate 300 to cover the active pattern 331. For example, the gate insulation layer 310 may include silicon oxide, silicon oxynitride, metal oxide, etc. The drain electrode 333 and the source electrode 335 may be disposed on the first insulating interlayer 320. The drain electrode 333 and the source electrode 335 may be formed through the gate insulation layer 310 and the first insulating interlayer 320 to make contact with the drain region and the source region of the active pattern 331. For example, each of the drain electrode 333 and the source electrode 335 may include polysilicon, metal, metal nitride, alloy, etc. The gate electrode 337 may be positioned on the gate insulation layer 310. The gate electrode 337 may include polysilicon, metal, metal nitride, alloy, etc.

The second insulating interlayer 340 may be disposed on the thin film transistor 330 and the first insulating interlayer 320. For example, each of the first insulating interlayer 320 and the second insulating interlayer 340 may include silicon compound such as silicon oxide, silicon nitride, silicon oxynitride, etc.

The first electrode 360 (e.g., an anode) may be disposed on the second insulating interlayer 340. The first electrode 360 may be electrically connected to the drain electrode 333. For example, the first electrode 360 may include a transparent conductive material such as indium tin oxide (ITO), zinc tin oxide (ZTO), indium zinc oxide (IZO), zinc oxide (ZnOx), gallium oxide (GaOx), tin oxide (SnOx), etc. Alternatively, the first electrode 360 may include metal such as silver, aluminum, platinum, gold, chromium, tungsten, molybdenum, titanium, palladium, etc. In example embodiments, the first electrode 360 may have a single layer structure including a transparent material film and/or a metal film. In some example embodiments, the first electrode 360 may have a multi layer structure including at least one transparent material film and/or at least one metal film. For example, the first electrode 360 may include a multi layer structure having a first indium tin oxide film, a silver film and a second indium tin oxide film.

The pixel defining layer 370 may be disposed on the second insulating interlayer 340 and the first electrode 360. The pixel defining layer 370 may define the red, the green and the blue sub-pixel regions 300R, 300G and 300B. In example embodiments, the pixel defining layer 370 may serve as the isolation pattern 370 (see FIG. 7A) to divide the red, the green and the blue sub-pixel regions 300R, 300G and 300B. For example, the pixel defining layer 370 may include polyimide-based resin, acryl-based resin, etc.

In example embodiments, the hole injection layer 380 may be disposed on the pixel defining layer 370 and the first electrode 360. The red light emitting layer 390R, the green light emitting layer 390G and the blue light emitting layer 390B may be positioned in openings of the pixel defining layer 370 where the hole injection layer 380 may be disposed. Here, the red light emitting layer 390R, the green light emitting layer 390G and the blue light emitting layer 390B may be disposed in the red sub-pixel region 300R, the green sub-pixel region 300G and the blue sub-pixel region 300B, respectively.

The electron injection layer 400 may be disposed on the red light emitting layer 390R, the green light emitting layer 390G, the blue light emitting layer 390B and the pixel defining layer 370. The second electrode 410 (e.g., a cathode) may be disposed on the electron injection layer 400. The second electrode 410 may include a transparent conductive material such as indium tin oxide, zinc tin oxide, indium zinc oxide, zinc oxide, tin oxide, etc.

Figure 8:
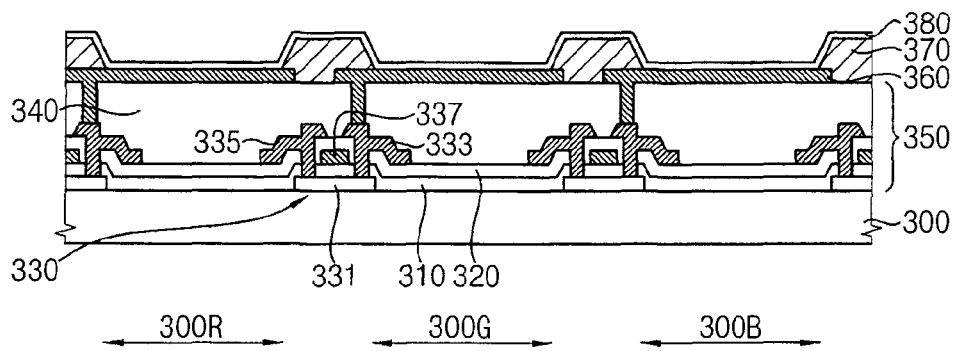
FIGS. 8 to 10 are cross sectional views illustrating a method of manufacturing an organic light emitting display device in accordance with example embodiments.
Figure 9:
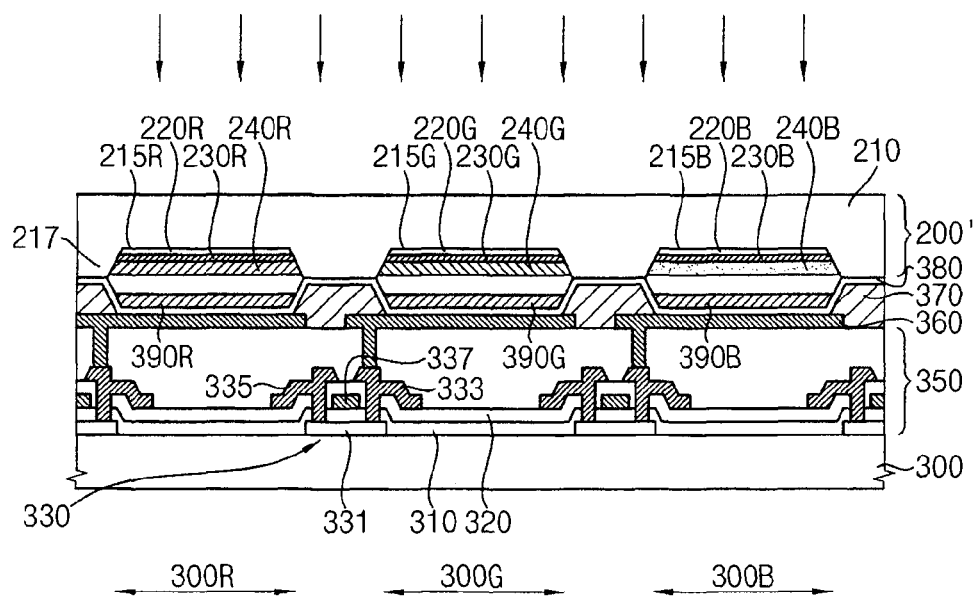
Figure 10:
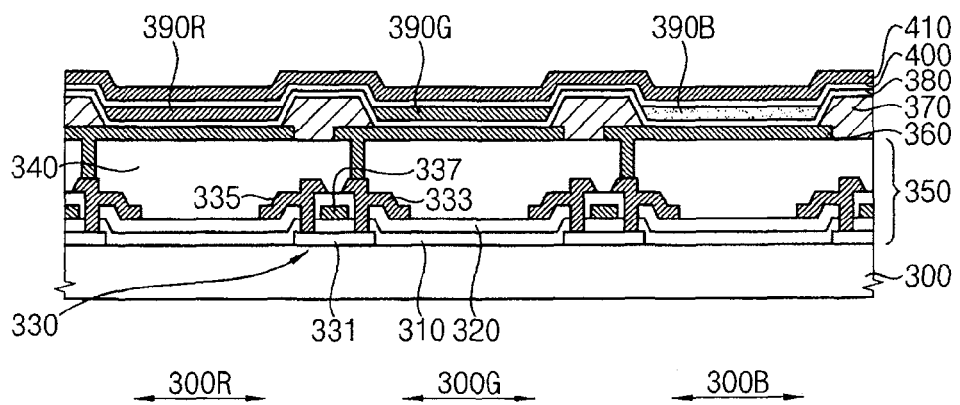

FIGS. 8 to 10 are cross sectional views illustrating a method of manufacturing an organic light emitting display device in accordance with example embodiments. The method illustrated in FIGS. 8 to 10 may provide an organic light emitting display device having a construction substantially the same as or substantially similar to that of the organic light emitting display device described with reference to FIG. 7B.

Referring to FIG. 8, a first electrode 360 may be formed on a switching structure 350 located on a first substrate 300. Here, the switching structure 350 may include a thin film transistor 330, a first insulating interlayer 320 and a second insulating interlayer 340 as illustrated in FIG. 7B. Further, the thin film transistor 330 may include a gate insulation layer 310, an active pattern 331, a drain electrode 333, a source electrode 335, a gate electrode 337, etc.

The first electrode 360 may be formed on the switching structure 350 using a transparent material, metal, etc. In example embodiments, the first electrode 360 may be obtained by forming an electrode layer (not illustrated) on the switching structure 350 and by patterning the electrode layer. The first electrode 360 may extend in a red sub-pixel region 300R, a green sub-pixel region 300G and a blue sub-pixel region 300B of the first substrate 300.

A pixel defining layer 370 may be formed on the switching structure 350 and the first electrode 360. In example embodiments, a preliminary pixel defining layer (not illustrated) may be formed using polyimide-based resin or acryl-based resin to cover the switching structure 350 and the first electrode 360, and then the preliminary pixel defining layer may be patterned to form the pixel defining layer 370 having openings that expose portions of the first electrode 360 in the red, the green and the blue sub-pixel regions 300R, 300G and 300B. In this case, regions exposed by the openings of the pixel defining layer 370 may be defined as the red, the green and the blue sub-pixel regions 300R, 300G and 300B.

A hole injection layer 380 may be formed to cover the first electrode 360 and the pixel defining layer 370. In example embodiments, the hole injection layer 380 may be formed by a spin coating process, a slit coating process, a printing process, etc.

In some example embodiments, a hole transfer layer may be additionally formed on the hole injection layer 380. The hole transfer layer may be formed using the above-described material.

Referring to FIG. 9, a donor substrate (not illustrated) having a constitution substantially the same as or substantially similar to that of the donor substrate 200 described with reference to FIG. 2 may be arranged relative to the first substrate 300.

In formation of the donor substrate according to example embodiments, a first recess, a second recess and a third recesses may be formed on a substrate. Upper portions of the substrate exposed by the first, the second and the third recesses may be defined as isolation structures. Therefore, the isolation structures may be formed integrally with the substrate. A first lower layer, a second lower layer and a third lower layer may be formed in the first recess, the second recess and the third recess, respectively. A first light-to-heat conversion layer, a second light-to-heat conversion layer and a third light-to-heat conversion layer may be respectively formed on the first lower layer, the second lower layer and the third lower layer. Further, a first organic transfer layer, a second organic transfer layer and a third organic transfer layer may be formed on the first light-to-heat conversion layer, the second light-to-heat conversion layer and the third light-to-heat conversion layer, respectively. The isolation structures of the donor substrate may substantially correspond to the pixel defining layer 370. The first, the second and the third organic transfer layers, which are respectively including a red light emitting layer, a green light emitting layer and a blue light emitting layer in the first, the second and the third recesses, may be arranged to be corresponded to the red sub-pixel region 300R, the green sub-pixel region 300G and the blue sub-pixel region 300B, respectively.

A laser beam may be irradiated into a rear face of the donor substrate. For example, the laser beam may be irradiated to a face of the substrate 210 opposed to the first, the second and the third recesses. Thus the red, the green and the blue light emitting layers of the donor substrate may be formed on the hole injection layer 380 in the red, the green and the blue sub-pixel regions 300R, 300G and 300B of the first substrate 300. In this case, the first, the second and the third light-to-heat conversion layers may convert energy of the laser beam to thermal energy, and thus the first, the second and the third organic transfer layers on the first, the second and the third light-to-heat conversion layers may sublimate by the thermal energy. Accordingly, the first, the second and the third organic transfer layers may be transferred into the red, the green and the blue sub-pixel regions 300R, 300G and 300B of the first substrate 300. As a result, the red, the green and the blue light emitting layer 390R, 390G and 390B may be formed on the hole injection layer 380. The isolation structures of the donor substrate may be arranged to substantially correspond to the pixel defining layer 370 on the first substrate 300, so that the first organic transfer layer may be easily transferred onto the red sub-pixel region 300R, and the isolation structure 217 may prevent the first organic transfer layer 240R from being mixed into adjacent sub-pixel regions. Similarly, the second organic transfer layer and the third organic transfer layer may also be easily transferred onto the green sub-pixel region 300G and the blue sub-pixel region 300B, respectively without being mixed into adjacent sub-pixel regions. Therefore, the organic transfer layers having minute dimensions may be effectively transferred onto the first substrate 300. Even though the laser beam may be irradiated onto a relatively large region of the donor substrate, the light emitting layers 390R, 390G and 390B may be precisely formed in corresponding sub-pixel regions to reduce a processing time for forming the light emitting layers 390R, 390G and 390B.

In example embodiments, the laser induced thermal imaging process may be performed under a reduced pressure. For example, in a space confined by the isolation structures of the donor substrate and the pixel defining layer 370 of the first substrate 300, the first, the second and the third organic transfer layers of the donor substrate may sublimate by the thermal energy caused by the irradiation of the laser beam, so that the red, the green and the blue light emitting layers 390R, 390G and 390B may be formed on the first substrate 300. When the laser induced thermal imaging process is executed under the reduced pressure, the organic transfer layers of the donor substrate may be effectively transferred with a relatively low power of the laser beam, and transferred light emitting layers 390R, 390G and 390B may have desired surface characteristics. In some example embodiments, the laser induced thermal imaging process may be carried out under an atmospheric pressure.

In some example embodiments, additional coating layers including hydrophobic solutions may be formed on the isolation structures of the donor substrate, such that the red, the green and the blue light emitting layers 390R, 390G and 390B may be more effectively and precisely formed over the first substrate 300.

Referring to FIG. 10, the red, the green and the blue light emitting layers 390R, 390G and 390B may be formed on the hole injection layer 380 in the red, the green and the blue sub-pixel region 300R, 300G and 300B in accordance with the laser induced thermal imaging process. An electron injection layer 400 and a second electrode 410 may be sequentially formed on the red light emitting layer 390R, the green light emitting layer 390G, the blue light emitting layer 390B and the hole injection layer 380. A protection layer (not illustrated) and a second substrate (not illustrated) may be formed on the second electrode 410 to provide the organic light emitting display device.

In some example embodiments, before forming the electron injection layer 400, an electron transfer layer may be additionally formed on the red light emitting layer 390R, the green light emitting layer 390G, the blue light emitting layer 390B and the hole injection layer 380.

In a method of manufacturing an organic light emitting display device according to example embodiments, isolation structures of a donor substrate may be arranged to correspond relative to a pixel defining layer of a first substrate, and organic transfer layers may be transferred from the donor substrate onto the first substrate. Accordingly, the isolation structures may protect or prevent the organic transfer layers from being mixed into adjacent pixel regions. Additionally, the organic transfer layers having minute dimensions may be effectively transferred onto the first substrate. Furthermore, a laser beam may be irradiated into a relatively large portion of the donor substrate, so that a processing time for forming organic light emitting layers may be reduced.

According to example embodiments, a donor substrate may include a light-to-heat conversion layer and an organic transfer layer disposed in a recess formed on a substrate. A portion of the substrate adjacent to the recess may serve as an isolation structure. The organic light emitting layer having a minute dimension may be effectively obtained from the organic transfer layer of the donor substrate. The isolation structure may be formed integrally with the substrate, and thus the donor substrate may be recycled after a laser induced thermal imaging process.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function, and not only structural equivalents, but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The invention is defined by the following claims, with equivalents of the claims to be included therein.

What is claimed is:

1. A donor substrate comprising:
   a substrate having a recess and an isolation structure adjacent to the recess;
   a light-to-heat conversion layer in the recess;
   an organic transfer layer on the light-to-heat conversion layer; and
   a lower layer between a bottom face of the recess and the light-to-heat conversion layer.

2. The donor substrate of claim 1, wherein the lower layer comprises at least one selected from the group consisting of silicon, acryl-based resin, polyimide-based resin, siloxane-based resin, benzocyclobutene (BCB), silicon oxide and metal oxide.

3. The donor substrate of claim 1, wherein the lower layer comprises a coating layer and a heat radiation layer.

4. The donor substrate of claim 1, wherein the substrate comprises a material having a transmittance for a laser beam.

5. The donor substrate of claim 1, wherein the light-to-heat conversion layer comprises at least one selected from the group consisting of metal, metal oxide, metal sulfide and carbon black.

6. The donor substrate of claim 5, wherein the light-to-heat conversion layer comprises at least one selected from the group consisting of nickel, molybdenum, titanium, zirconium, copper, vanadium, tantalum, palladium, ruthenium, iridium, gold, silver, platinum, oxide thereof and sulfide thereof.

7. The donor substrate of claim 1, wherein the organic transfer layer comprises a red organic transfer layer, a green organic transfer layer or a blue organic transfer layer.

8. A donor substrate comprising:
   a substrate having a first recess, a second recess, a third recess and isolation structures being defined by the first, the second and the third recesses;

a first light-to-heat conversion layer, a second light-to-heat conversion layer and a third light-to-heat conversion layer in the first recess, the second recess and the third recess, respectively;

a red organic transfer layer on the first light-to-heat conversion layer;

a green organic transfer layer on the second light-to-heat conversion layer;

a blue organic transfer layer on the third light-to-heat conversion layer; and a first lower layer between a bottom face of the first recess and the first light-to-heat conversion layer.

9. The donor substrate of claim 8, further comprising:

a second lower layer between a bottom face of the second recess and the second light-to-heat conversion layer; and a third lower layer between a bottom face of the third recess and the third light-to-heat conversion layer.

10. The donor substrate of claim 9, wherein each of the first, the second and the third lower layers comprises at least one selected from the group consisting of silicon, acryl-based resin, polyimide-based resin, siloxane-based resin, benzocyclobutene, silicon oxide and metal oxide.

11. The donor substrate of claim 9, wherein each of the first, the second and the third lower layers comprises a coating layer and a heat radiation layer.

12. A donor substrate comprising:

a substrate having a recess and an isolation structure adjacent to the recess;

a light-to-heat conversion layer in the recess, wherein the light-to-heat conversion layer does not extend across the isolation structure; and an organic transfer layer on the light-to-heat conversion layer.

* * * * *